United States Patent [19]

Hirasawa

[11] 4,164,666

[45] Aug. 14, 1979

[54] ELECTRONIC APPARATUS USING COMPLEMENTARY MOS TRANSISTOR DYNAMIC CLOCKED LOGIC CIRCUITS

[75] Inventor: Masataka Hirasawa, Kanagawa, Japan

[73] Assignee: Toyko Shibaura Electric Co., Ltd., Japan

[21] Appl. No.: 804,440

[22] Filed: Jun. 7, 1977

[30] Foreign Application Priority Data

Jun. 8, 1976 [JP] Japan .................................. 51-66704
Jun. 8, 1976 [JP] Japan .................................. 51-66711
Jul. 31, 1976 [JP] Japan .................................. 51-91649

[51] Int. Cl.² ....................... H03K 21/30; G06F 1/04; H03K 19/08
[52] U.S. Cl. ............................... 307/208; 307/220 C; 307/247 A; 307/262; 307/269; 307/293; 340/365 R; 364/900
[58] Field of Search ................... 307/262, 269, 247 A, 307/293, 208, 220 C, 221 C, 225 C; 328/72, 73, 77, 78; 58/50 R; 340/365 R, 365 S, 365 C, 365 E; 364/707, 900 MS File, 200 MS File

[56] References Cited

U.S. PATENT DOCUMENTS

| | | |
|---|---|---|
| 3,597,600 | 8/1971 | Herendeen .................. 340/365 S X |
| 3,675,239 | 7/1972 | Ackerman et al. ............... 340/365 S |
| 3,764,997 | 10/1973 | Hatano et al. ................ 340/365 S X |
| 3,818,441 | 6/1974 | Nomiya et al. ............... 340/365 E X |
| 3,941,989 | 3/1976 | McLaughlin et al. ........... 364/900 X |
| 4,021,656 | 5/1977 | Caudel et al. .................... 307/262 X |
| 4,074,262 | 2/1978 | Nomiya et al. ................... 340/365 S |

Primary Examiner—Larry N. Anagnos
Attorney, Agent, or Firm—Finnegan, Henderson, Farabow and Garrett

[57] ABSTRACT

An electronic apparatus comprises a timer circuit driven for a given time in response to a key input, complementary MOS transistor clocked dynamic logic circuits each with an output storage capacitance, clock signal supply souce for supplying complementary clock signals to the clocked dynamic logic circuits during the operative period of the timer circuit, and for supplying voltages with fixed levels to the clocked logic circuits during the inoperative period of the timer circuit. During the inoperative period, the output capacitance of the clocked logic circuit is fixed at a fixed potential level. This prevents the simultaneous turning-on of the complementary transistors in a succeeding logic circuit connected to the clocked logic circuits, resulting in little power consumption even when a power switch is not used.

10 Claims, 14 Drawing Figures

4,164,666

ELECTRONIC APPARATUS USING COMPLEMENTARY MOS TRANSISTOR DYNAMIC CLOCKED LOGIC CIRCUITS

BACKGROUND OF THE INVENTION

The present invention relates to an electronic apparatus using complementary MOS transistor clocked dynamic logic circuits.

To reduce power consumption and make the apparatus size small, recent various electronic apparatuses such as electronic table top calculators employ integrated circuits having logic circuits comprising p- and n-channel complementary MOS transistors and a liquid crystal (hereinafter often abbreviated as LC) display device. Apparatuses which have been developed and put into practice are, for example, electronic watches operable without exchange of batteries for one to two years and table top calculators usable for about 1,000 hours without exchange of batteries. The conventional electronic apparatus such as the table top calculator, however, is necessarily provided with a power switch. An operator sometimes fails to turn off the power switch when he finishes his calculating work by using the calculator. This leads to wasteful and superfluous power consumption.

SUMMARY OF THE INVENTION

Accordingly, the primary object of the invention is to provide an electronic apparatus with complementary MOS transistor logic gates in which power consumption in the logic gates may be reduced to a negligible degree during an unused period of the apparatus, without use of the power switch.

According to one aspect of the invention, there is provided an electronic apparatus comprising: timer circuit means; timer circuit enabling means for applying a control signal to the timer circuit means to enable the timer circuit means to produce at the output a fixed level voltage for a fixed time; complementary MOS transistor dynamic clocked logic circuits each having output storage capacitance, each of the logic circuits being enabled by a complementary pair of clock pulse signals to execute a logic function and, during the disabling period of time, storing a logic output signal at the output storage capacitance; and clock pulse supplying means coupled with the timer circuit means which supplies clock pulse signals to the complementary MOS transistor dynamic clock logic circuits during the enabling period of time of the timer circuit means, and supplies voltages with fixed levels to the complementary MOS transistor logic circuits during the disabling period of the timer circuit means.

In the apparatus of the invention, in the disabling period or inoperative period of the timer circuit means, the output levels of the complementary MOS transistor clocked logic circuits are stabilized at logical "1" or "0" level, so that voltages each with a fixed level appear at the outputs of the clocked logic circuits. When complementary MOS transistor clocked logic circuits are disabled, the circuits each has at the output thereof switching means for providing a fixed potential in response to the enabling operation thereof when the timer circuit means is disabled. In a dynamic shift register including a first and second clocked inverters connected in cascade fashion and driven by two-phase clock pulse signals, the first clocked inverter may be disabled during the inoperative period of the timer circuit means, and the second clocked inverter may be enabled. In this case, the switching means is connected to the output of the first clocked inverter to provide a fixed potential at the output of the first clocked inverter. Alternatively, the first and second clocked inverters may both be enabled. When an input signal with a fixed level is applied to the shift register, the output levels of the first and second clocked inverters are stabilized. In a case where the first and second clocked inverters are disabled and enabled, respectively, during the inoperative period of the timer circuit, a third clocked inverter may be provided for feeding back the output of the second clocked inverter to the input thereof during the inoperative period of the timer circuit means. In this case, the output data when the timer circuit means is operating can be kept at the output of the second clocked inverter during the inoperative period of the timer circuit.

Other objects and features of the present invention will be apparent from the following description taken in connection with the accompanying drawings, in which:

DETAILED DESCRIPTION OF THE PREFERRED EMBODIMENTS

Figure 1:
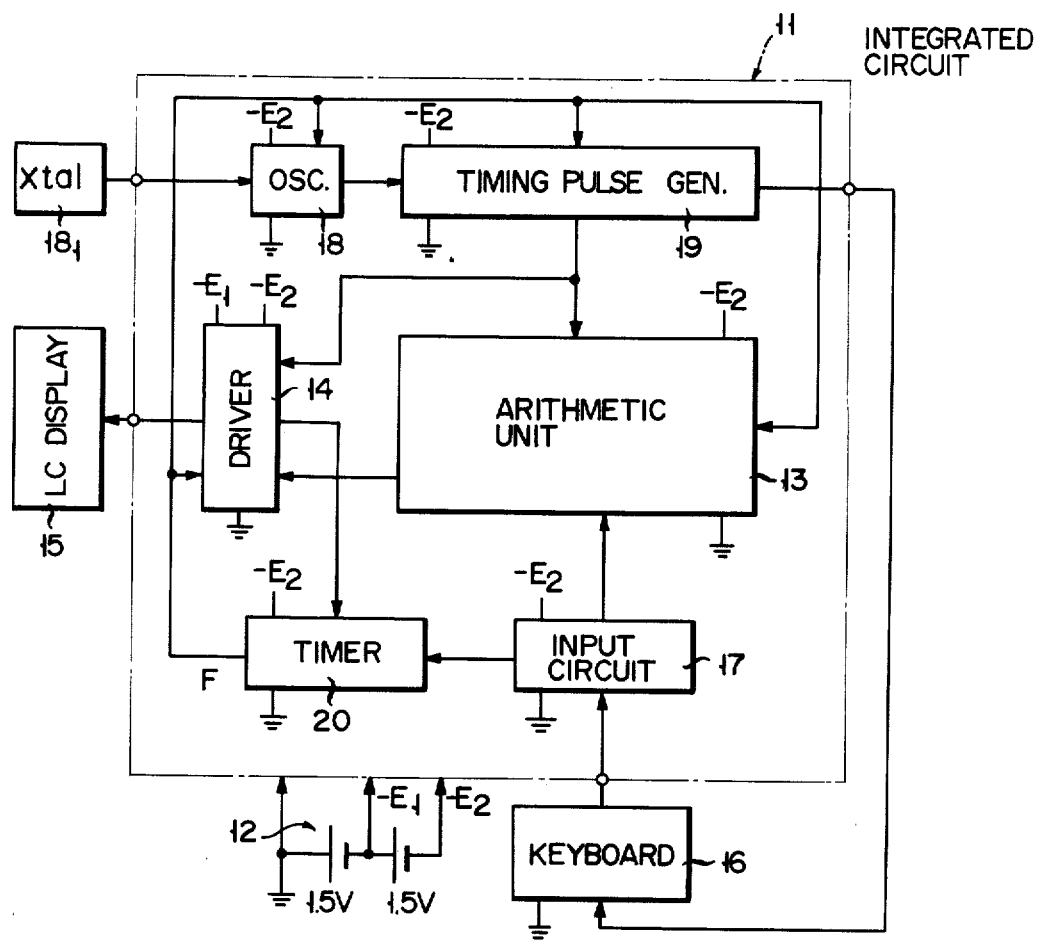
FIG. 1 shows a block diagram of an embodiment of an electronic apparatus according to the present invention.

In the embodiments of the invention to be described hereinafter, a negative logic system is used in which a low potential level ($-3$ V) is logical "1" (set) and a high potential level (0 V) is logical "0" (reset). Reference will be made to FIG. 1 illustrating in block form a table top electronic calculator according to the invention. In the figure, reference numeral 11 designates an integrated circuit section, and 12 designates a power source section for the integrated circuit 11 which uses two dry cell batteries of 1.5 V, for example. An arithmetic unit designated by reference numeral 13 in the integrated circuit 11 feeds the results of a calculation to a liquid crystal display device 15 through a driver circuit 14. A keyboard section 16 inputs necessary data and function instructions to the arithmetic unit 13 through an input circuit 17. An oscillating circuit 18 is connected to a block 18₁ including a quartz crystal, resistors, capacitors and the like which are necessary for oscillation of the oscillator 18. A timing pulse generator 19 for generating various timing pulses is connected to the oscillating circuit 18. The timing pulse generator 18 produces clock pulses, bit pulses, and digit pulses which are necessary for operations of the arithmetic unit 13, the driver circuit 14, and a timer circuit 20, and to key strobe signals transferred to the input circuit 17 through the keyboard 16. In response to a key depression on the keyboard 16, the timer circuit 20 initiates operations of the oscillator 18, the timing pulse generator 19, the driver circuit 14 and the arithmetic unit 13, while at the same time the timer itself starts a clocking operation for a given period of time in response to pulse signals from the driver circuit 14. After completion of the clocking operation, the timer circuit 20 stops the operations of the oscillating circuit 18, the timing pulse generator 19, the driver circuit 14 and the arithmetic unit 13. When keys are successively depressed on the keyboard 16, the timer circuit 20 initiates the clocking operation in response to the first depression of a key and terminates the clocking operation after a lapse of a given period of time from the final depression of a key. The timer circuit 20 may also be constructed such that it initiates the clocking operation in response to the output signal of the oscillator 18 or the timing pulse generator 19.

Figure 2:
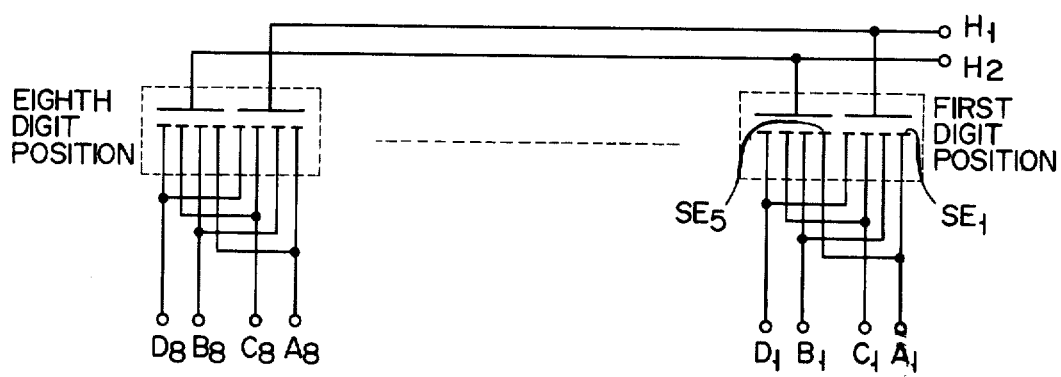
FIG. 2 is a wiring diagram of an LC display device.

Referring now to FIG. 2, there is shown a known dynamic driven 8-digits liquid crystal display device using a $\frac{1}{4}$ duty-$\frac{1}{2}$ prebias system. Each digit display section comprises an 8-segment and two common electrodes device including a decimal point segment.

Figure 3:
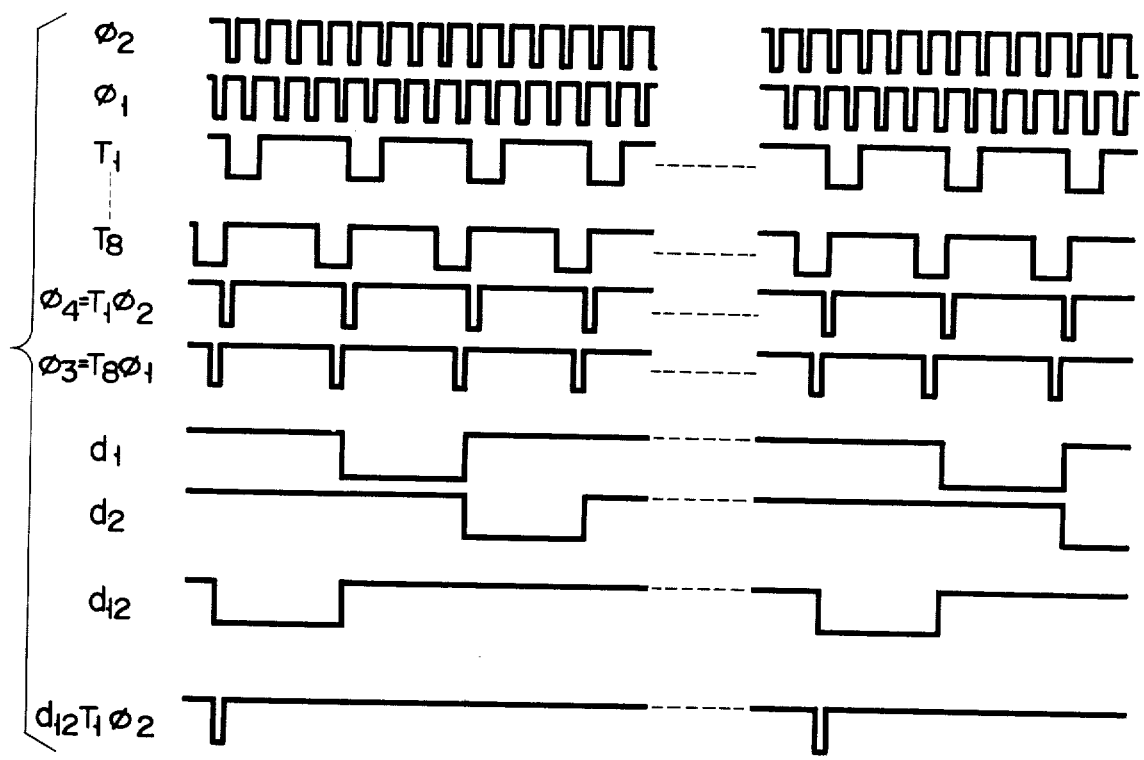
FIG. 3 is waveforms of timing signals generated by a timing signal generator.
Figure 4:
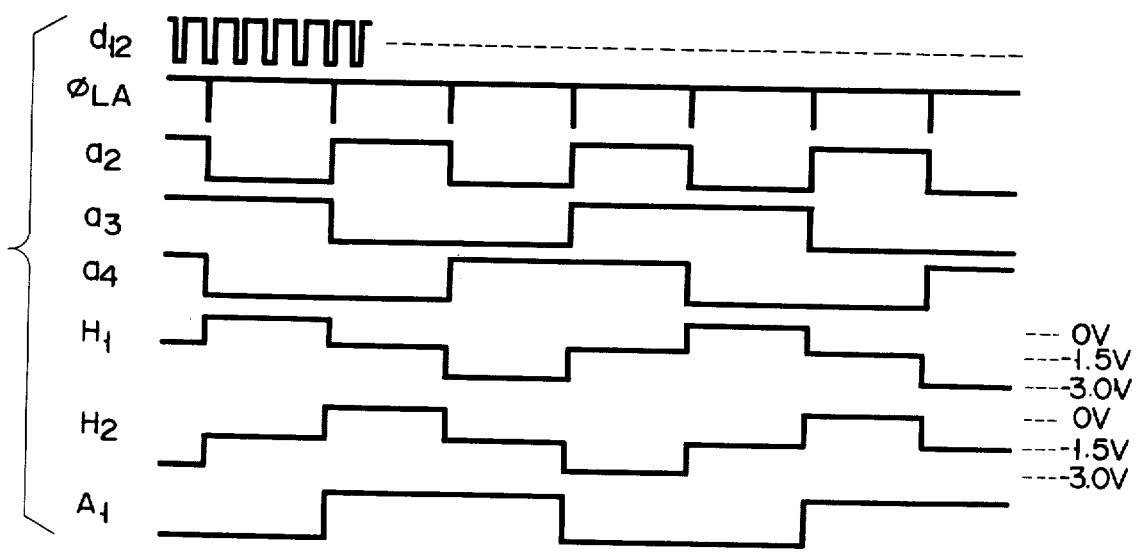
FIG. 4 is waveforms of signals for driving the LC display device.

FIG. 3 shows timing signals generated by the timing pulse generator 19 and FIG. 4 shows LC (liquid crystal) drive signal produced by the driver circuit 14. In FIG. 3, $\phi_1$ and $\phi_2$ are 2-phase clock pulses, $T_1$, $T_2$, $T_4$ and $T_8$ bit pulses, $d_1$ to $d_{12}$ digit pulses, $\phi_3$ ($T_8\phi_1$) and $\phi_4$ ($T_1\phi_2$) timing pulses generated at one digit time intervals, and $d_{12}T_1\phi_2$ timing pulses generated in synchronism with digit pulses $d_{12}$. The digit pulses are used as key strobe signals in this embodiment.

In FIG. 4, $\phi_{LA}$ represents pulses defining one display period of LC which are produced every four cycle periods of digit pulses $d_{12}$, and the cycle period of $\phi_{LA}$ is 0.2 to 10 msec. Pulse $a_2$ designates the scanning timing of scanning pulses $H_1$ and $H_2$ which are applied to the common electrodes, pulses $a_4$ designate the polarity of the scanning pulses $H_1$ and $H_2$ at the scanning time. To be more precise, when the pulse $a_4$ is logical "1" or $-3$ V, the pulses $H_1$ and $H_2$ scan the LC at ground potential level. When the pulse $a_4$ is logical "0" or at ground potential level, the pulses $H_1$ and $H_2$ scan the LC at $-3$ V. Except during the scanning period, the scanning pulses $H_1$ and $H_2$ are set at a middle level or $-1.5$ V. $A_1$ is a LC segment driving data signal of logical "0" level and $A_1$ is applied to the LC when the pulse $a_3$ is logical "1". In the example of FIGS. 2 and 4, a segment $SE_1$ is lit to which the data signal $A_1$ is applied and which faces a common electrode to which the scanning pulse $H_1$ of $-3$ V is applied. On the other hand, a segment $SE_5$ is not lit to which the data signal $A_1$ is applied and which faces a common electrode to which the scanning pulse $H_2$ of 0 V is applied. The display method shown in FIGS. 2 and 4 is well known and thus no further description of it will be necessary.

Figure 5A:
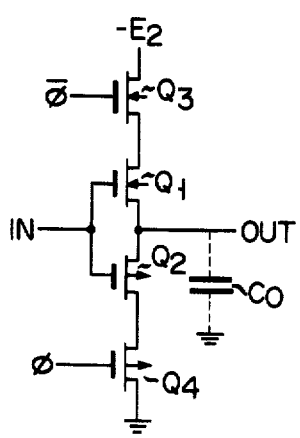
FIGS. 5A to 5C show circuit diagrams of clocked inverters to be used in the invention and a logical symbol thereof.

Before preceeding with the description of a major part of the FIG. 1 circuit, description will be made about a clocked inverter as a basic complementary MOS transistor clocked dynamic logic circuit, referring to FIGS. 5A to 5C. In the clocked inverter in FIG. 5A, inverting transistors $Q_1$ and $Q_2$ and clocking transistors $Q_3$ and $Q_4$ are connected in series across a power source. The transistors $Q_1$ and $Q_3$ are n-channel MOS transistors and the transistors $Q_2$ and $Q_4$ are p-channel MOS transistors. An output storage capacitance $C_0$ exists between the connection point between the inverting transistors $Q_1$ and $Q_2$ and ground. Complementary clock pulses $\bar{\phi}$ and $\phi$ are applied to the gate electrodes of the clocking transistors $Q_3$ and $Q_4$, respectively. When the transistors $Q_3$ and $Q_4$ are conductive, i.e. complementary clock pulses $\bar{\phi}$ and $\phi$ are "0" and "1", respectively, an output signal which is the inverse of an input signal is applied to output storage capacitance $C_0$. Conversely, when the transistors $Q_3$ and $Q_4$ are nonconductive, i.e. the clock pulses $\bar{\phi}$ and $\bar{\phi}$ are "1" and "0", respectively, the output capacitance $C_0$ stores the output signal. In this clocked inverter, the clocking transistors $Q_3$ and $Q_4$ may be connected between the inverting transistors $Q_1$ and $Q_2$.

Figure 5B:
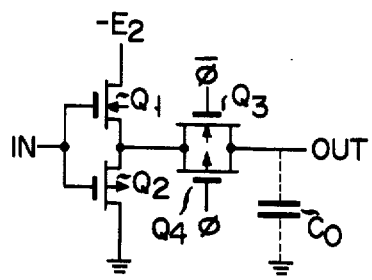
Figure 5C:
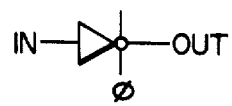

A clocked inverter shown in FIG. 5B comprises a basic complementary inverter including inverting transistors $Q_1$ and $Q_2$, and a transmission gate including clocking transistors $Q_3$ and $Q_4$. In this clocked inverter, when the clocking transistors $Q_3$ and $Q_4$ are conductive, an output signal which is the inverse of an input signal is applied to an output storage capacitance $C_0$ existing between the output of the transmission gate and ground. On the other hand, when the transistors $Q_3$ and $Q_4$ are non-conductive, the output capacitance $C_0$ stores the output signal. In this specification, the complementary clocked inverter as shown in FIGS. 5A and 5B is represented by a logical symbol as shown in FIG. 5C. The above-mentioned complementary MOS transistor dynamic clocked inverter is well known to those skilled in the art and complementary MOS transistor dynamic clocked logic circuits having NAND or NOR function are also known. In the above-mentioned clocked logic gate, the period that the output capacitance $C_0$ can sustain data during the disabling period is at most 1 second, and, when time lapses more than 1 second, the output capacitance cannot sustain a desired logical level due to leak current. Mere control of the oscillating operation of the oscillator by the timer circuit permits simultaneous conduction of complementary MOS transistors of a complementary logic circuit connected to the output of a clocked logic gate disabled or clocked logic circuit enabled. For this reason, a relatively large current flows through the complementary MOS transistors connected in series across the power source so that, during the inoperative period of the timer circuit, i.e. of the electronic apparatus, a relatively large amount of power will be consumed.

In the present invention, during the inoperative period of the timer circuit, enabling voltages or disabling voltages are applied to the complementary clocking MOS transistors of the dynamic clocked logic circuits to enable or disable the logic circuits. The output capacitance of the logic circiuts which are disabled is set at a given potential level by a level stabilizing means.

Figure 6:
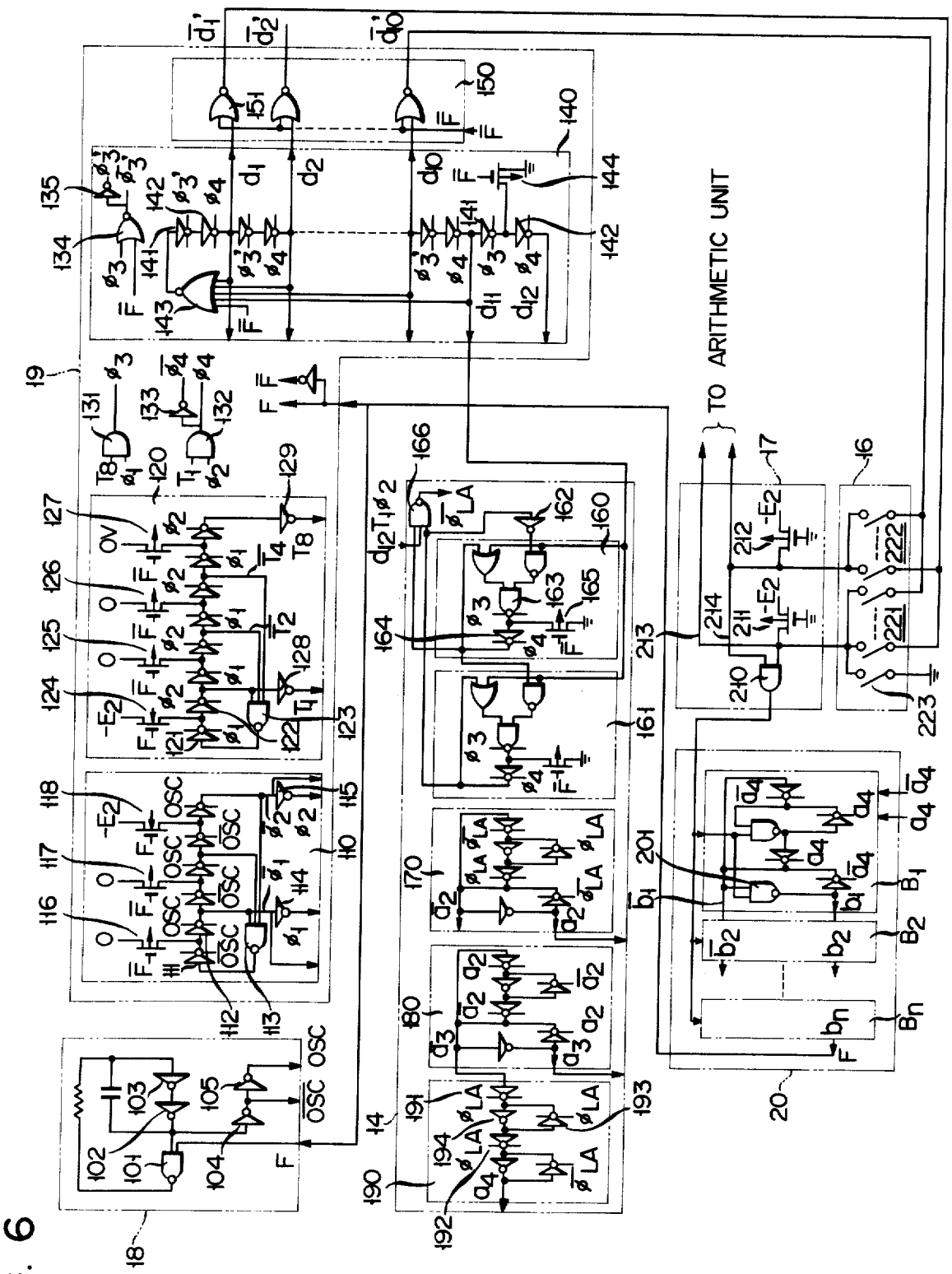
FIG. 6 is a circuit diagram of part of the electronic apparatus shown in FIG. 1.

An embodiment of the invention will be described in detail with reference to FIG. 6 illustrating a major part of the electronic apparatus of FIG. 1. FIG. 6 is a detail illustration of the driver circuit 14, the input circuit 17, the oscillator 18, the timing pulse generator 19, the timer circuit 20 and the keyboard circuit 16.

The oscillator 18 comprises three complementary MOS transistor phase inverters 101, 102 and 103, and, in this example, the inverter 101 comprises an NAND circuit to which the output signal F of the timer circuit 20 is applied. When the timer circuit 20 is set during an operation the electronic apparatus, $F=1$. Therefore, the oscillator 18 performs its oscillating operation so that complementary oscillation pulses $\overline{OSC}$ and OSC are delivered from complementary inverters 104 and 105. During an inoperative period of the apparatus, the timer circuit 20 is reset so that the NAND circuit 101 is disabled and thus the oscillator 18 does not operate. At this time, since F=0, $\overline{OSC}$=0 (0 V) and OSC=1 (−3 V).

Reference numeral 110 designates a clock pulse generator in the timing pulse generator 19. The clock pulse generator 110 comprises a scale-of-4 counter including a dynamic shift register with three stages each having complementary MOS transistor clocked inverters 111 and 112 connected in cascade fashion, and a complementary transistor NAND circuit 113 having inputs connected with the respective stages of the dynamic shift register and an output coupled with the input of the shift register. The clocked inverters 111 and 112 are alternately enabled and disabled by the output pulses $\overline{OSC}$ and OSC of the oscillator 18. In the case of clocked inveters 111, the output $\overline{OSC}$ is applied to the p-channel transistor $Q_4$ of the clocked inverter as shown in FIG. 5A, and the output OSC is applied to the n-channel transistor $Q_3$. In the case of clocked inverters 112, the output OSC is fed to the p-channel transistor $Q_4$ and the output $\overline{OSC}$ is fed to the n-channel transistor $Q_3$. Therefore, when the output $\overline{OSC}$ is "1", the clocked inverters 111 are enabled and clocked inverters 112 are disabled. When the output $\overline{OSC}$ is "0", clocked inverters 111 are disabled and the clocked inverters 112 are enabled. Two-phase clock signal $\phi_1$ and $\phi_2$ are delivered from the inverters 114 and 115. When the timer circuit 20 is reset, since $\overline{OSC}$=0 and OSC=1 as mentioned above, clocked inverters 111 are disabled and clocked inverters 112 are enabled. In order to avoid excessive power consumption in succeeding clocked inverters 112 due to an unstable output logical level of clocked inverters 111, MOS transistors 116, 117 and 118 are connected to the outputs of inverters 111. Each of MOS transistors 116, 117 and 118 is rendered conductive during the reset period of the timer circuit 20 to provide a constant voltage to the output capacitance. 0 V is applied to the outputs of the clocked inverters of the first and second stages. −$E_2$ V (−3 V) is given to the clocked inverter 111 of the third stage. This eliminates the simultaneous conduction of the complementary inverting MOS transistors of the clocked inverters 112. In this manner, the output level of the clocked inverters 112 is stabilized so that an excessive power consumption in the inverters 114 and 115 is also avoided. During the reset period of the timer circuit 20, the clock generator 110 produces the output voltages, $\phi_1$=0, $\overline{\phi}_1$=1, $\phi_2$=1 and $\overline{\phi}_2$=0.

Reference numeral 120 designates a bit pulse generator in the timing pulse generator 19. The bit pulse generator 120 comprises a scale-of-4 counter having a four stage shift register with each stage of which including a couple of complementary MOS transistor clocked inverters 121 and 122 connected in cascade, and a complementary MOS transistor NAND gate 123 having inputs connected with the outputs of the first to third stages of the shift register and an output connected to the input of the shift register. The clocked inverters 121 and 122 are driven by the output pulses $\phi_1$, $\overline{\phi}_1$, $\phi_2$ and $\overline{\phi}_2$ from the clock pulse generator 110. As described above, during the reset period of the timer circuit 20, $\phi_1$=0 and $\phi_2$=1, so that the clocked inverters 121 are disabled and the clocked inverters 122 are enabled. Accordingly, as in the case of the clock pulse generator 110, MOS transistors 124 to 127 to the outputs of clocked inverters 121 to provide fixed voltages to output storage capacitors of clocked inverters 121 during the reset period of timer circuit 20. −$E_2$ volt is applied to the output of the first stage clocked inverter 121 by an n-channel transistor 124 the gate electrode of which is supplied with the signal F (=0). 0 V is applied to the outputs of the second, third and fourth stage clocked inverters 121 by p-channel transistors 125, 126 and 127 the gate electrodes of which are supplied with the signal $\overline{F}$ (=1). Inverters 128 and 129 connected with the outputs of the first and fourth stage clocked inverters 122 produce bit pulses $T_1$ and $T_8$. During the reset period of the timer circuit 20, $T_1$=1 and $T_8$=0. The clock pulse $\phi_3$ is produced by an AND gate 131 which receives the clock pulse $\phi_1$ and bit pulse $T_8$. Clock $\phi_4$ is produced by an AND circuit 132 which receives the bit pulse $T_1$ and the clock $\phi_2$, and clock $\overline{\phi}_4$ is produced by an inverter 133. Further, the clock $\overline{\phi}'_3$ is produced by a NOR gate 134 receiving the clock $\phi_3$ and the signal $\overline{F}$. An inverter 135 produces clock $\phi'_3$. During the reset period that the timer circuit 20 is reset and hence $\overline{F}$=1, $\phi'_3$=1. Further, since $T_1$=1 and $\phi_2$=1, $\phi_4$=1.

Reference numeral 140 designates a digit pulse generator in the timing signal generator 19. The digit pulse generator comprises a 12 stage shift register each stage of which includes a couple of clocked inverters 141 and 142 connected in cascade, and NOR gate 143 having inputs connected to the outputs of the first to 11th stages and the output F, and an output connected to the input of the first stage of the shift register. The succeeding clocked inverters 142 in the respective stages are driven by complementary clocks $\phi_4$ and $\overline{\phi}_4$, the preceding clocked inverters 141 in the first to 11th stages are driven by complementary clocks $\phi'_3$ and $\overline{\phi}'_3$, and the preceding clocked inverter 141 in the 12th stage is driven by complementary clocks $\phi_3$ and $\overline{\phi}_3$.

As described previously, during the reset period, $\phi_4$=1 and $\phi'_3$=1 so that all of the clocked inverters in the first to 11th stages are enabled. $\overline{F}$=1 and thus the output of the NOR gate 143 is always 0 during the reset period. For this reason, the input level of the shift register is stabilized and the output of each stage is also stabilized. The clocked inverter 141 in the 12th stage or final stage is disabled since $\phi_3$=0 during the reset period. On the other hand, the clocked inverter 142 in the final stage is enabled since $\phi_4$=1. Therefore, the output of the preceding clocked inverter 141 in the final stage is stabilized at 0 volt through a p-channel transistor 144 which is turned on by the output $\overline{F}$. The preceding clocked inverter 141 in the final stage may be driven by the complementary clocks $\phi'_3$ and $\overline{\phi}'_3$, as in the case of the preceding clocked inverters 141 in the other stages. In this case, the stabilizing means 144 for stabilizing the output level of the clocked inverter 141 is unnecessary.

The outputs $d_1$ to $d_{10}$ of the digit pulse generator 140 are coupled with the corresponding NOR gates 151 of the key strobe signal generator 150, respectively. The output $\overline{F}$ is coupled with the other inputs of the NOR gates 151. The outputs $\overline{d'}_1$ to $\overline{d'}_{10}$ of key strobe signal generator 150 are coupled with the input circuit 17 through the keyboard section 16. Since $\overline{F}$=1 during the reset period, the outputs $\overline{d'}_1$ to $\overline{d'}_{10}$ are all 0.

Reference numerals 160 and 161 designate dynamic shift registers which receive the digit pulse output $d_{11}$ from the digit pulse generator 140. The output of the shift register 160 is coupled with an input of the shift register 161 and the output of the shift register 161 is coupled in negative feedback fashion with an input of the shift register 160 through an inverter 162. This constitutes a scale-of-4 counter for the digit pulse $d_{11}$. The shift registers 160 and 161 are provided with a dynamic clocked NAND gate 163 driven by the complementary clock $\phi_3$ and $\bar{\phi}_3$ and a clocked inverter 164 driven by the complementary clocks $\phi_4$ and $\bar{\phi}_4$. Since $\phi_3=0$ and $\phi_4=1$ during the reset period, as previously stated, the clocked NAND gate 163 is disabled and the clocked inverter 164 is enabled. Therefore, 0 V is given to the output of the clocked NAND gate 163 by a p-channel transistor 165 which is enabled by output $\bar{F}(=1)$. Pulse $\phi_{LA}$ is produced by an NAND gate 166 to which the outputs of the shift registers 160 and 161 and the timing pulse $d_{12}T_1\phi_2$ are coupled. During the reset period, the outputs of the clocked inverters 164 are all 1 and the timing pulse $d_{12}T_1\phi_2$ is 1. As a result $\bar{\phi}_{LA}=0$ and $\phi_{LA}=1$.

A static binary counter 170 frequency-divides the complementary clocks $\phi_{LA}$ and $\bar{\phi}_{LA}$ by a factor of 2 to produce the complementary pulses $a_2$ and $\bar{a}_2$. Another static binary counter 180 frequency-divides the complementary pulses $a_2$ and $\bar{a}_2$ by a factor of 2 to produce complementary pulses $a_3$ and $\bar{a}_3$. A static shift register designated by 190 delays the pulse $\bar{a}_3$ by one cycle period of the pulse $\phi_{LA}$ to produce pulse $a_4$. The level stabilization according to the invention is unnecessary for the static circuit. More precisely, in the case of the shift register 190, for example, since $\phi_{LA}=1$ and $\bar{\phi}_{LA}=0$ during the reset period, clocked inverters 191 and 192 are disabled and enabled, respectively. A basic inverter 194 and a clocked inverter 193 which is enabled during the reset period are connected to the output of the clocked inverter 191. Accordingly, the output level of the clocked inverter 191 may be sustained at the output level of the inverter 191 produced immediately before the timer circuit 20 is reset.

The timer circuit 20 is provided with n static binary counters $B_1$ to $B_n$ connected in cascade fashion. The first binary counter $B_1$ is arranged to frequency-divide by 2 complementary pulses $a_4$ and $\bar{a}_4$ produced by the display driver circuit 14 and the second stage binary counter $B_2$ to frequency-divide by 2 the output signals $b_1$ and $\bar{b}_1$ of the first stage counter, and the final stage binary counter $B_n$ to frequency-divide by 2 the output signals $b_{n-1}$ and $\bar{b}_{n-1}$ of the n-1th binary counter $B_{n-1}$. The set outputs $b_1, b_2, \ldots b_n$ (F) of the binary counters $B_1, B_2, \ldots B_n$ are set to logical "1" level (-3 V) by a set signal from a input circuit 17 which is produced by the key actuation at the keyboard 16. When the output F of the timer circuit 20 is set, the oscillator 18, the timing pulse generator 19, and the driver circuit 14 start to operate, and the output F of the timer circuit 20, after its set, is reset after the time of $2^{n-1}$ times the one cycle period $T_A$ of the pulse $a_4$. The timer circuit 20 may be modified to take various forms. An R-S flip-flop circuit may be connected to the output side of the timer circuit 20 of FIG. 6. In this case, the output $b_n$ of the nth frequency-divider $B_n$ is connected to the set input of the R-S flip-flop circuit, and the output of the input circuit 17 is coupled with the reset input thereof.

The input circuit 17 is provided with an AND gate 210 of which the output is coupled with the frequency dividing stages of the timer circuit 20, and the inputs connected to $-E_2$ volts through p-channel transistors 211 and 212 whose gates are grounded, respectively. The keyboard section 16 is provided with a function switch group 221 connected by way of a line 213 to one of the inputs of the AND gate 210 and with an entry key group 222 connected by way of a line 214 to another input of the AND gate 210. Another key 223 connected to the former input of the AND gate 210 by way of the line 213 is a clear key.

In the input circuit 17, when no key is depressed, the output of the AND gate 210 is logical "1" since the inputs thereto are logical "1". When one of the function and entry keys is depressed, one of the inputs of the AND gate 210 becomes logical "0". The reason for this is that, since $\bar{F}=1$ at this time, the outputs $d'_1$ to $d'_{10}$ of the key strobe signal generator 150 are logical "0". When the input of the AND gate 210 becomes logical "0", the output thereof becomes "0". Accordingly, the output of the NAND gates 201 in the frequency-dividers $B_1$ to $B_n$ become logical "1". In other words, the outputs $b_1, b_2, \ldots b_n$ (F) of the frequency-dividers $B_1$ to $B_n$ are set.

Since the digit pulse generator 140 operates after the output F is set, key actuation on the keyboard 16 delivers a key strobe signal to the arithmetic unit 213 via the line 213 or 214. Whether a depressed key is an function key or the entry key is identified by energization of the line 213 or 214. a kind of a depressed function key is identified by the key strobe signal on the line 213. A key strobe signal on the line 214 identifies the kind of an entry key being depressed.

Alternatively, NOR gates 151 of the key strobe signal generator 150 may be substituted by NAND gates to which the output F is coupled. In this case, only actuation of the clear key 223, of which one end is grounded, switches the output of the AND gate 210, i.e. the output F of the timer circuit 20. The reason for this is that when F=0, the outputs $d'_1$ to $d'_{10}$ of the NAND gates are all "1" and thus actuation of the keys other than the clear key fails to switch the output of the AND gate 210.

Figure 7:
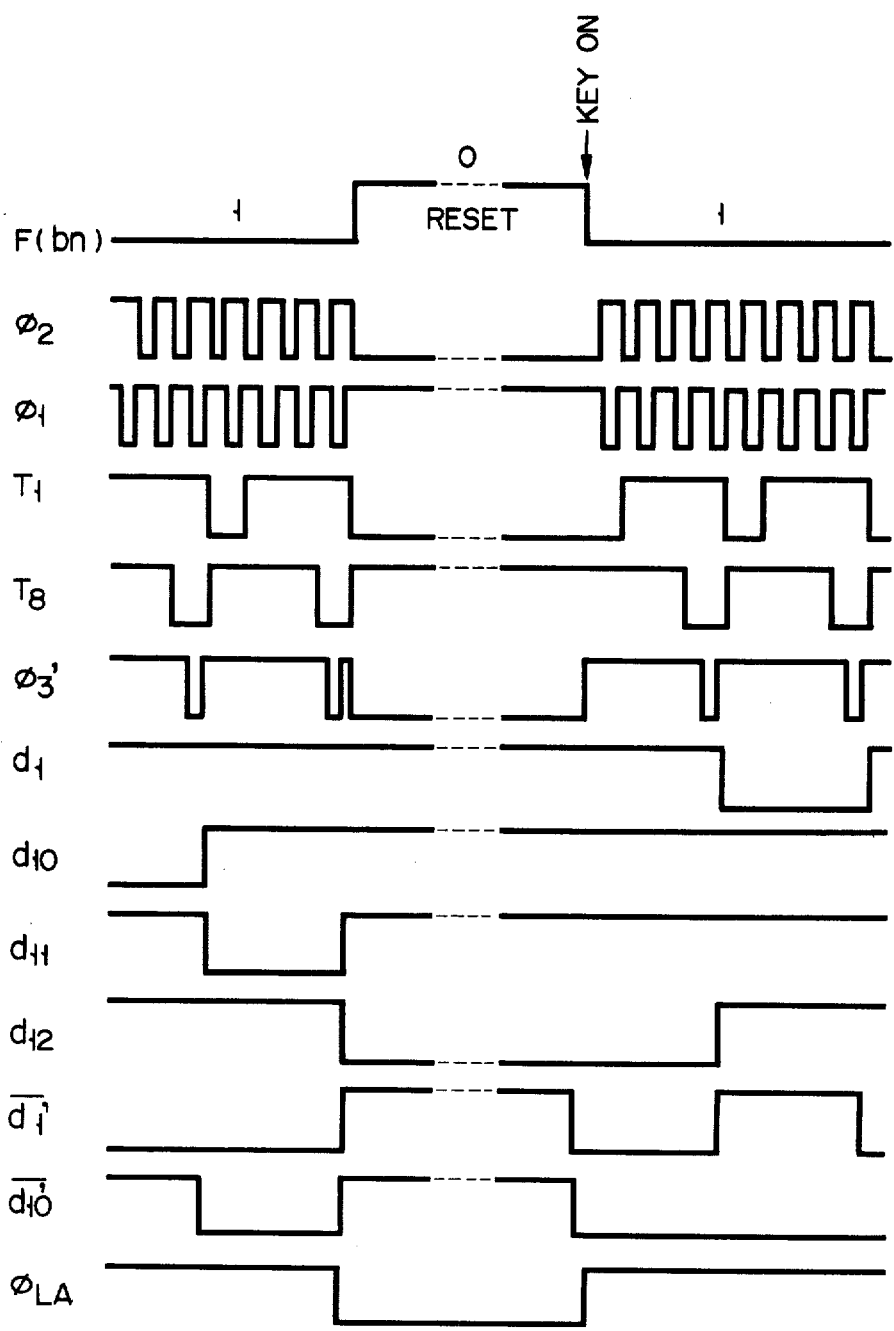
FIG. 7 shows waveforms of various timing signals for operative and inoperative periods of time of a timer circuit shown in FIG. 1.

FIG. 7 shows waveforms of various timing signals when the output F is set or reset.

The level stabilizing means as shown in FIG. 6 is also applied to dynamic clocked logic gates in the arithmetic unit 13.

Figure 8:
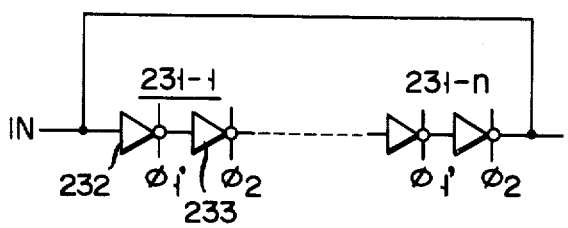
FIGS. 8 to 11 show some examples of dynamic shift registers according to the invention.
Figure 8:
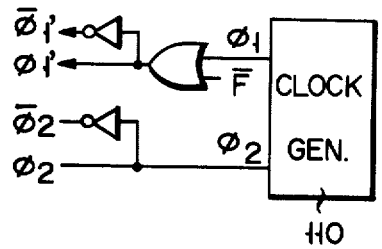

FIG. 8 shows an n stage circulating dynamic shift register in which the output of a final stage 231-n is positively fed back to the input of a first stage 231-1. Each stage of the circulating dynamic shift register comprises a preceding clocked inverter 232 driven by the read-in pulses $\bar{\phi}'_1$ and $\phi'_1$ formed by logical summation of output $\bar{F}$ and the clock $\phi_1$ which is generated by the clock generator 110, and a succeeding clocked inverter 233 driven by clocks $\bar{\phi}_2$ and $\phi_2$. As described above, since $\phi_1=0$ during the reset period of the timer circuit 20, $\phi'_1=1$ and $\phi_2=1$. The result is that clocked inverters 232 and 233 in each stage are enabled. Since the shift register is of a circulating type, the output level of each clocked inverter is fixed at 0 volt or −3 volt during the reset period.

Figure 9:
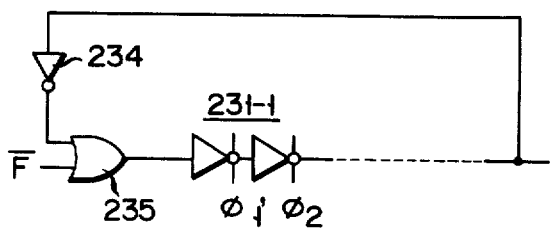
Figure 10:
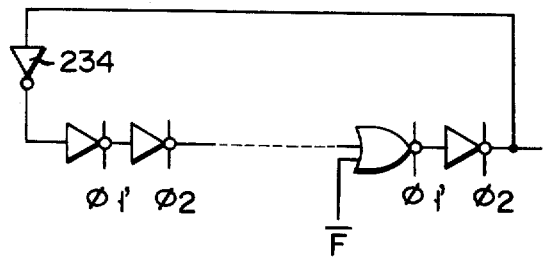

FIG. 9 shows another dynamic shift register in which the output of the final stage is negatively fed back to the input of the first stage through an inverter 234. In this shift register, odd number of inverters are connected in cascade fashion, so that the shift register operates as a ring oscillator during the reset period. To avoid the ring oscillation, this example employs an OR gate 235 inserted between the inverter 234 and the first stage 231-1 and receiving the signal $\bar{F}$. During the reset period, since $\bar{F}=1$, the output levels of respective clocked inverters are stable. To avoid the ring oscillation, one of the clocked inverters in the shift register may be substituted by a clocked NOR gate receiving $\bar{F}$, as shown in FIG. 10.

Figure 11:
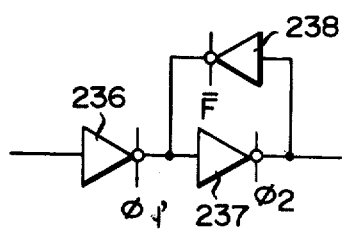

A dynamic shift register shown in FIG. 11 can hold data during the reset period. In this example, a preceding clocked inverter 236 is driven by the clocks $\phi_1$ and $\bar{\phi}_1$ and thus disabled during the reset period. Since a succeeding clocked inverter 237 is driven by the clocks $\phi_2$ and $\bar{\phi}_2$, it is enabled during the reset period. And the output of the succeeding clocked inverter 237 is negatively fed back to the input thereof through a clocked inverter 238 driven by the signals F and $\bar{F}$. Since the clocked inverter 237 is enabled during the reset period, the clocked inverters 236 and 237 hold, during the reset period, output voltage levels produced immediately before the timer circuit 20 is reset.

Figure 12:
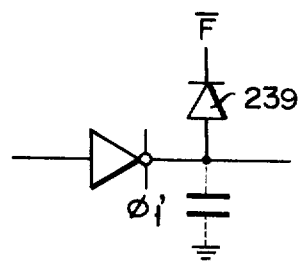
FIG. 12 shows another example for stabilizing the output level of a clocked logic gate.

In FIG. 6, the output voltage level of the clocked inverter disabled during the reset period is stabilized by the MOS transistor; however, a diode 239 may be used as shown in FIG. 12, for stabilizing the output level.

In the example of FIG. 6, the operation of the oscillator 18 is disabled during the reset period. If the oscillator is of low power consumption type, the oscillator may be designed so as to operate continuously. In this case, it is only required that operations of other circuits consuming more electric power be disabled. In a case where a circuit performing a continuous operation such as a clock (time-keeping) circuit is provided in the electronic apparatus, the invention may be adaptable for circuits driven by timing pulses such as oscillation pulses fed from such a continuous operating circuit. For example, when the timing pulses from the clock circuit are used instead of the oscillated pulses from the oscillator 18, the timing pulses from the clock circuit given to the clock generator 110 may be controlled by the logical gate receiving the output signal from a timer circuit 20.

The electronic apparatus thus far mentioned of the invention may suppress to a negligible degree the power consumption during the inoperative period of the electronic apparatus using dynamic clocked logic gates adaptable for high density integrated circuit, even without use of a power switch. For a LC display, its power consumption may be saved by stabilizing voltages applied to the common electrode and the segment electrodes during the reset period of the timer circuit 20.

What is claimed is:

1. An electronic apparatus comprising:
   timer circuit means having enable and disable periods;
   timer circuit enabling means for initiating said enable period of said timer circuit means by applying a control signal to said timer circuit means to enable said timer circuit means to produce at the output thereof a fixed level voltage for a fixed time;
   dynamic clocked logic circuits each having at least one input, an output having a storage capacitance, and first and second clock inputs; each of said logic circuits being alternately enabled and disabled by a complementary pair of clock pulses applied to said first and second clock inputs, and while enabled each logic circuit producing output signals at said outputs whose voltage level depends upon the voltage level at said inputs and while disabled storing said output signals in said storage capacitance; and
   clock pulse supplying means coupled with said timer circuit means for supplying clock pulses to said first and second clock inputs of said dynamic clocked logic circuits during said enable periods of said timer circuit means, and for supplying disabling voltages with fixed levels to said first and second clock inputs of said dynamic clocked logic circuits during said disable periods of said timer circuit 2. An electronic apparatus comprising:
   timer circuit means having enable and disable periods;
   timer circuit enabling means for initiating said enable periods of said timer circuit means by applying a control signal to said timer circuit means to enable said timer circuit means to produce at the output thereof a fixed level voltage for a fixed time;
   dynamic clocked logic circuits each having at least one input, an output having a storage capacitance, and first and second clock inputs, each of said logic circuits being alternately enabled and disabled by a complementary pair of clock pulses applied to said first and second clock inputs, and while enabled each logic circuit producing output signals at said outputs whose voltage level depends upon the voltage level at said inputs, and while disabled, storing said output signals in said storage capacitance;
   clock pulse supplying means coupled to said timer circuit means for supplying clock pulses to said first and second clock inputs of said dynamic clocked logic circuits during said enable periods of said timer circuit means, and supplying to said first and second clock inputs of said logic circuits voltages with such a fixed level as to disable said dynamic clocked logic circuits during said disable periods of said timer circuit means; and
   means coupled to said outputs of said clocked logic circuits and to said timer circuit means for supplying a fixed level potential to said storage capacitance during said disable periods of said timer circuit means.

3. An electronic apparatus comprising:
   timer circuit means having enable and disable periods;
   timer circuit enabling means for initiating said enable periods of said timer circuit means by applying a control signal to said timer circuit means to enable said timer circuit means to produce at the output thereof a fixed level voltage for a fixed time;
   first and second clocked inverters each having an input, an output having a storage capacitance, and first and second clock inputs, said inverters connected in cascade fashion with the output of said first clocked complementary inverter connected to the input of said second clocked inverter, said first and second inverters each being periodically enabled and disabled by complementary clock signals applied to said first and second clock inputs and while enabled said inverters providing an output signal to said output capacitance which is the inverse of an input signal applied to said input and while disabled storing said output signal at said storage capacitance, said first and second clocked complementary inverters being enabled in different phases; and
   clock pulse supplying means coupled to said timer circuit means for supplying clock signals to said first and second clock inputs of said first and second clocked inverters during said enable period of said timer circuit means, and supplying voltages with fixed levels to said first and second clock inputs of said first and second clocked inverters to enable said first and second clocked inverters during said disable period of said timer circuit means.

4. An electronic apparatus comprising:
timer circuit means having enable and disable periods;
timer circuit enabling means for initiating said enable periods of said timer circuit means by applying a control signal to said timer circuit means to enable said timer circuit means to produce at the output thereof a fixed level voltage for a fixed time;
first and second clocked inverters each having an input, an output having a storage capacitance, and first and second clock inputs, said inverters being connected in cascade fashion with the output of said first clocked inverter connected to the input of said second clocked inverter, said first and second clocked inverters each being periodically enabled and disabled by complementary clock signals applied to said first and second clock inputs; while enabled said inverters providing an output signal at said output which is the inverse of an input signal applied to said input and while disabled storing said output signal at said capacitance, said first and second clocked inverters being enabled in different phase;
clock pulse supplying means coupled to said timer circuit means for supplying clock signals to said first and second clock inputs of said first and second clocked inverters during said enable period of said timer circuit means, and for supplying to said first and second clock inputs of said first and second clocked inverters output voltages with fixed levels to disable said first clocked inverter and enable said second clocked inverter during said disable period of said timer circuit means; and
means coupled with the output of said first clocked inverter for supplying a potential with a fixed level to said output capacitance during disable period of said timer circuit means.

5. An electronic apparatus comprising:
timer circuit means having enable and disable periods;
timer circuit enabling means for initiating said enable periods of said timer circuit means by supplying a control signal to said timer circuit means to enable said timer circuit means to produce at the output thereof a fixed level voltage for a fixed time;
first and second clocked complementary inverters each having an input, an output having a storage capacitance, and first and second clock inputs, said inverters being connected in cascade fashion with the output of said first clocked inverter connected to the input of said second clocked inverter, said first and second clocked inverters each being periodically enabled and disabled by complementary clock pulses applied to said first and second clock inputs and said inverters providing while enabled an output signal at said output which is the inverse of an input signal applied to said input and storing while disabled said output signal at said output capacitance, said first and second clocked complementary inverters being enabled in different phase;
clock pulse supplying means coupled with said timer circuit means for supplying a complementary pair of clock pulses to said first and second clocks inputs to said first and second clocked inverters during said enable periods of said timer circuit means, and for supplying to said first and second clock inputs output voltages with such fixed levels as to disable said first clocked inverter and enable said second clocked inverter during said disable periods of said timer circuit means; and
a third clocked inverter which is enabled during the disabled period of said timer circuit means to feed back the output of said second clocked inverter to the input thereof.

6. An electronic apparatus comprising:
timer circuit means having enable and disable periods;
timer circuit enabling means for initiating said enable periods of said timer circuit means by supplying a control signal to said timer circuit means to enable said timer circuit means to produce at the output thereof a fixed level voltage for a fixed time;
a shift register with a plurality of stages, each stage reading in input data applied to an input thereof in response to a first complementary pair of pulses and reading out the input data at an output thereof in response to a second complementary pair of pulses, said first and second clock pulses being successively applied to each stage; and
clock pulse signal supplying means coupled with said timer circuit means for supplying said first complementary pair of pulses and said second complementary pair of pulses to each stage of said shift register during said enable periods of said timer circuit means and supplying a first pair of fixed voltages and a second pair of fixed voltages to each stage of said shift register during said disable periods of said timer circuit means, said first pair of fixed voltages having the same levels as those of said first complementary pair of pulses when the input data is read in and said second pair of fixed voltages having the same levels as those of said second complementary pair of pulses when the input data is read out.

7. An electronic apparatus accordng to claim 6, further comprising means for positively feeding back the output of said shift register to the input thereof.

8. An electronic apparatus according to claim 6, further comprising inverter means for negatively feeding back the output of said shift register to the input thereof, and means providing in a closed loop including said inverter and said shift register for making constant the output levels at respective stages of said shift register means during the disable periods of said timer circuit means.

9. An electronic apparatus according to claim 6, further comprising means for supplying an input voltage with a fixed level to the input of said shift register means during the disable period of said timer circuit means.

10. An electronic apparatus comprising:
timer circuit means;
timer circuit enabling means with a plurality of keys to enable said timer circuit means in response to the actuation of one of said keys thereby to provide a fixed level voltage for a fixed time;
dynamic clocked logic circuits each having an input, an output having a storage capacitance, and first and second clock inputs; said logic circuits each being periodically enabled and disabled by a complementary pair of clock pulses applied to said first and second clock inputs said logic circuits producing at said outputs an output signal whose voltage level depends on a voltage level of an input signal applied to said input while said logic circuits are enabled and storing said output signal at said storage capacitance while said logic circuits are disabled; and clock signal supplying means coupled with said timer circuit means for producing and supplying complementary clock pulses to said first and second clock inputs of said logic circuits when said timer circuit means is enabled, and for producing and supplying disabling fixed level voltages to said first and second clock inputs of said logic circuits when said timer circuit means is not enabled.

* * * * *

UNITED STATES PATENT AND TRADEMARK OFFICE
CERTIFICATE OF CORRECTION

PATENT NO. : 4,164,666
DATED : August 14, 1979
INVENTOR(S) : MASATAKA HIRASAWA

It is certified that error appears in the above-identified patent and that said Letters Patent are hereby corrected as shown below:

In Column 10, line 6, after "circuit" please insert -- means. --

In Column 12, line 40, "accordng" should read -- according --.

Signed and Sealed this

Eleventh Day of December 1979

[SEAL]

Attest:

SIDNEY A. DIAMOND

Attesting Officer    Commissioner of Patents and Trademarks